United States Patent
Wu et al.

(10) Patent No.: US 7,295,079 B2
(45) Date of Patent: Nov. 13, 2007

(54) CURRENT-CONTROLLED OSCILLATOR

(75) Inventors: Hai Jie Wu, Singapore (SG); Jing Sun, Singapore (SG)

(73) Assignee: Infineon Technologies AG, Munich (DE)

( * ) Notice: Subject to any disclaimer, the term of this patent is extended or adjusted under 35 U.S.C. 154(b) by 158 days.

(21) Appl. No.: 10/537,029

(22) PCT Filed: Nov. 29, 2002

(86) PCT No.: PCT/SG02/00283

§ 371 (c)(1),
(2), (4) Date: May 31, 2005

(87) PCT Pub. No.: WO2004/051841

PCT Pub. Date: Jun. 17, 2004

(65) Prior Publication Data

US 2006/0022760 A1    Feb. 2, 2006

(51) Int. Cl.
*H03K 3/03* (2006.01)
*H03L 1/00* (2006.01)

(52) U.S. Cl. ............ 331/57; 331/108 R; 331/176; 331/177 R

(58) Field of Classification Search ........... 331/57, 331/45, 108 A, 108 B, 108 C, 108 R, 177 R
See application file for complete search history.

(56) References Cited

U.S. PATENT DOCUMENTS

| | | | |
|---|---|---|---|
| 4,519,086 A * | 5/1985 | Hull et al. .......... 375/376 |
| 5,206,609 A * | 4/1993 | Mijuskovic ......... 331/57 |
| 5,420,547 A * | 5/1995 | Kikuchi ............ 331/57 |
| 5,600,280 A | 2/1997 | Zhang | |
| 5,799,051 A | 8/1998 | Leung et al. | |
| 6,633,202 B2 * | 10/2003 | Yang et al. ......... 331/57 |

OTHER PUBLICATIONS

Maneatis, "Low-Jitter Proces-Independent DLL and PLL Based on Self-Biased Techniques", IEEE Journal of Solid-State Circuits, vol. 31, No. 11, Nov. 1996, pp. 1723-1732, (10 pages).

Chan et al., "A 622-MHz Interpolating Ring VCO with Temperature Compensation and Jitter Analysis", IEEE International Symposium on Circuits and Systems, Jun. 1997, Hong Kong, pp. 25-28, (4 pages).

* cited by examiner

*Primary Examiner*—Robert Pascal
*Assistant Examiner*—Ryan J Johnson
(74) *Attorney, Agent, or Firm*—Maginot, Moore & Beck

(57) ABSTRACT

The present invention provides a current controlled oscillator comprising a first section providing a first differential output and a second section providing a second differential output. A loading structure comprised of resistive and reactive elements electrically connects the first differential output with the second differential output. The resistive and reactive elements have values chosen such that the resistive elements substantially extend the linear operating frequency range of the current controlled oscillator. Transistors of the loading structure have which are tied to a power supply rejection ratio compensation section for compensating for variations in power supply voltage.

22 Claims, 9 Drawing Sheets

CURRENT-CONTROLLED OSCILLATOR

FIELD OF THE INVENTION

The present invention relates to current-controlled oscillators and more particularly to a low voltage 3-stage current-controlled oscillator with extended linear gain and low sensitivity to process and temperature variation.

BACKGROUND OF THE INVENTION

In recent years the telecommunications industry has increased its demand for improved performance from current controlled oscillators (CCO). For example, when designing phase locked loops (PLL) for frequency synthesizers and clock recovery circuits, it helps to have a CCO with linear gain to allow better modeling during system design. Better modeling during system design helps avoid possible instability problems.

Additionally, it is important to reduce the CCO's power consumption and reduce the design margin. This can be achieved by designing the CCO to have low process and temperature sensitivity.

Conventional 3-stage ring oscillators of the prior art can have a wide tuning range, but the CCO gain is sensitive to process and temperature variation. The CCO gain is much higher when it works under low temperature, fast-fast (FFL) conditions than it works under high temperature, slow-slow (SSH) conditions. In order to make a conventional CCO oscillate over a certain frequency range, a much larger tuning range is required because of the process and temperature variations. Another problem with conventional CCO's is that the gain will drop, or become flat, at high frequencies, rather than increasing linearly, because of velocity saturation.

FIG. 1 illustrates a prior art circuit 7 comprising a conventional CCO fully differential inverter cell and its loading. Four pMOS transistors 9, 11, 13, 15 have their drains tied to the voltage Vdd. The gates of the transistors 9 and 15 are both tied to a voltage Vb 19. The voltabe Vb 19 is generated from a voltage Vbn 18 through a replica bias. Here, Vbn 18 is the control voltage for controlling the current $I_{control}$. The gate of transistor 11 is tied to the sources of the transistors 9 and 11 as well as to the output 8 of the differential outputs 10 and 8. The gate of transistor 13 is similarly tied to the sources of the transistors 13 and 15 as well as to the output 8 of the differential outputs 10 and 8. A capacitor 16 is connected between the differential outputs 10 and 8. This capacitor actually reduces the output frequency of the CCO 7, however, it is necessary for improving the jitter performance.

The nMOS transistors 12, 14 have gates supplied by current supply inputs 2 and 3 which are connected to the output of the previous stage of the inverter cell as illustrated in FIG. 9. The sources of the transistors 12, 14 are connected to the sources of the transistors 9, 11 and 13, 15, respectively. The source of the transistor 12 also leads to the differential output 8. Connected to the drains of the transistors 12, 14 is the source of another nMOS transistor 16 having its gate supplied by a voltage 18. The transistor 16 has its drain grounded.

FIG. 6 illustrates the CCO gain of the prior art circuit 7 of FIG. 1. Control current (in amps) is plotted along the x-axis while frequency (in Hertz) is plotted along the y-axis. There are separate curves for different design process corners and temperatures. The curves represent the SSH (slow-slow, high temperature), normal and FFL (fast-fast, low temperature) conditions. The curves, especially for the SSH condition tend to flatten when the control current becomes large. This is because the transistors 9, 15 enter the velocity saturation and their $g_m$ value does not continue to increase with control current.

An example of a prior art CCO design providing temperature variation compensation is presented in the paper entitled, "A 622-MHz Interpolating Ring VCO with Temperature Compensation and Jitter Analysis", by Wing-Hong Chan, published in the IEEE International Symposium on Circuits and Systems, Jun. 9-12, 1997, Hong Kong. However, the method this paper can only provide compensation at one fixed frequency and cannot compensate for process variation. In addition, it requires many additional circuits resulting in greater power consumption, size and cost.

Another example of a prior art CCO design is presented in "Low-Jitter Process-Independent DLL and PLL Based on Self-Bias Techniques', IEEE J. Solid-State Circuits, vol. 31, No. 11, November 1996 by John G. Maneatis. However, this prior art CCO does not sufficiently extend the linear region of the CCO gain or minimize the process and temperature sensitivity.

It would therefore be desirable to provide a CCO with extended linear gain over a broad tuning range, greater stability, reduced size and power consumption and reduced sensitivity to process and temperature variation. Additionally, it would be desirable to provide a CCO with these features while maintaining a good power supply rejection ratio (PSRR).

SUMMARY OF THE INVENTION

The present invention provides a CCO with extended linear gain over a broad tuning range, high stability, reduced size, reduced power consumption and reduced sensitivity to process and temperature variation. These features are achieved in the present invention by utilizing a 3-stage CCO processed in a CMOS. The CCO achieves low sensitivity to process variation and linear gain over a broad frequency range by utilizing an RC//C loading structure. The power supply rejection ratio is also improved using a power supply rejection ratio (PSRR) compensation section comprising a current source and diode electrically connected to the loading structure.

In general terms, the invention is for a current controlled oscillator comprising a first section providing a first differential output and a second section providing a second differential output. A loading structure comprised of resistive and reactive elements electrically connects the first differential output with the second differential output. The resistive and reactive elements have values chosen such that the resistive elements substantially extend the linear operating frequency range of the current controlled oscillator. Transistors of the loading structure have gates which are tied to a power supply rejection ratio compensation section for compensating for variations in power supply voltage.

BRIEF DESCRIPTION OF THE FIGURES

Further preferred features of the invention will now be described for the sake of example only with reference to the following figures, in which.

DETAILED DESCRIPTION OF THE EMBODIMENTS

Figure 1:
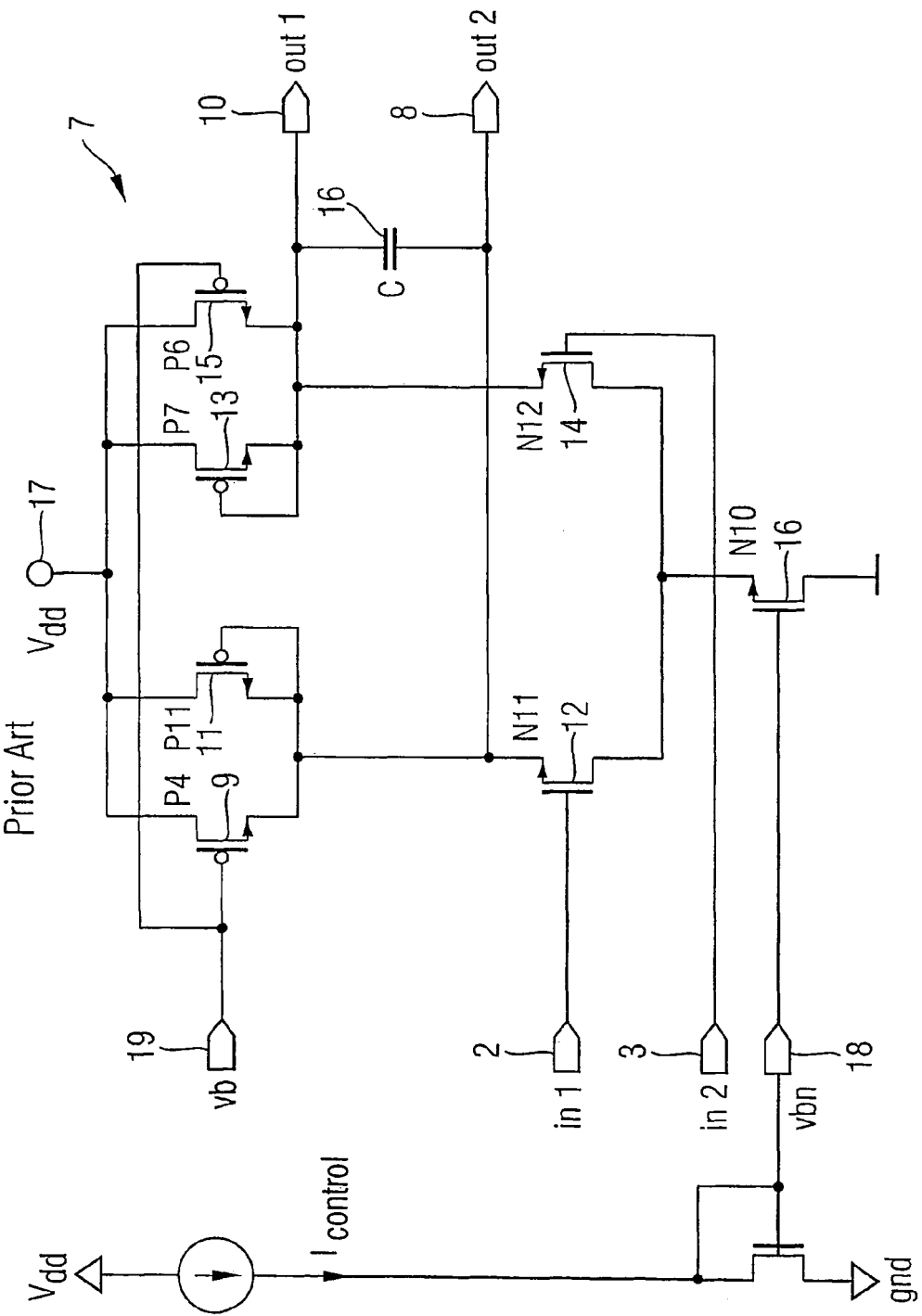
FIG. 1. illustrates a conventional CCO fully differential inverter cell and its loading.
Figure 2:
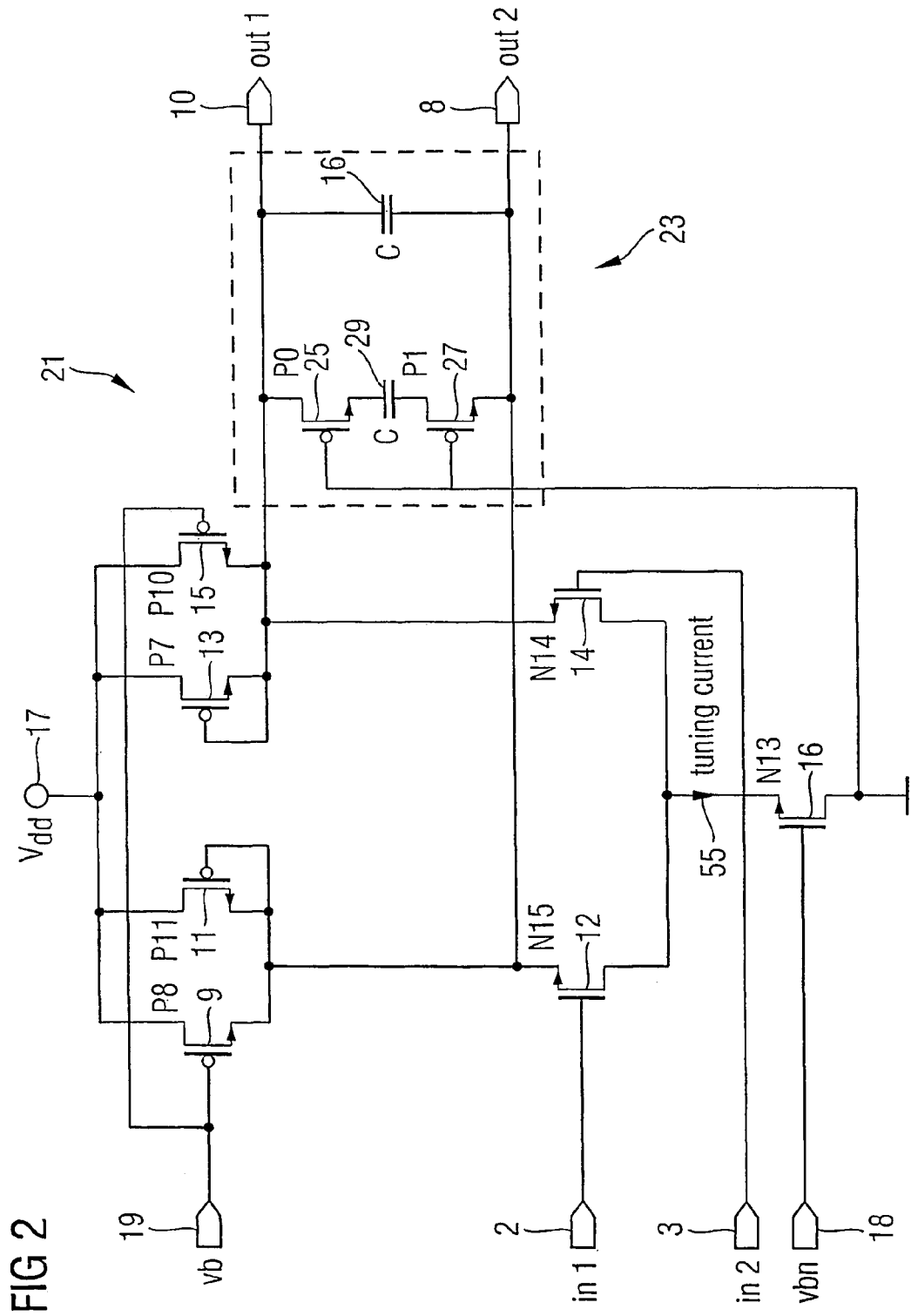
FIG. 2 illustrates a stage of the 3-stage CCO of the present invention utilizing an RC//C loading structure.
Figure 9:
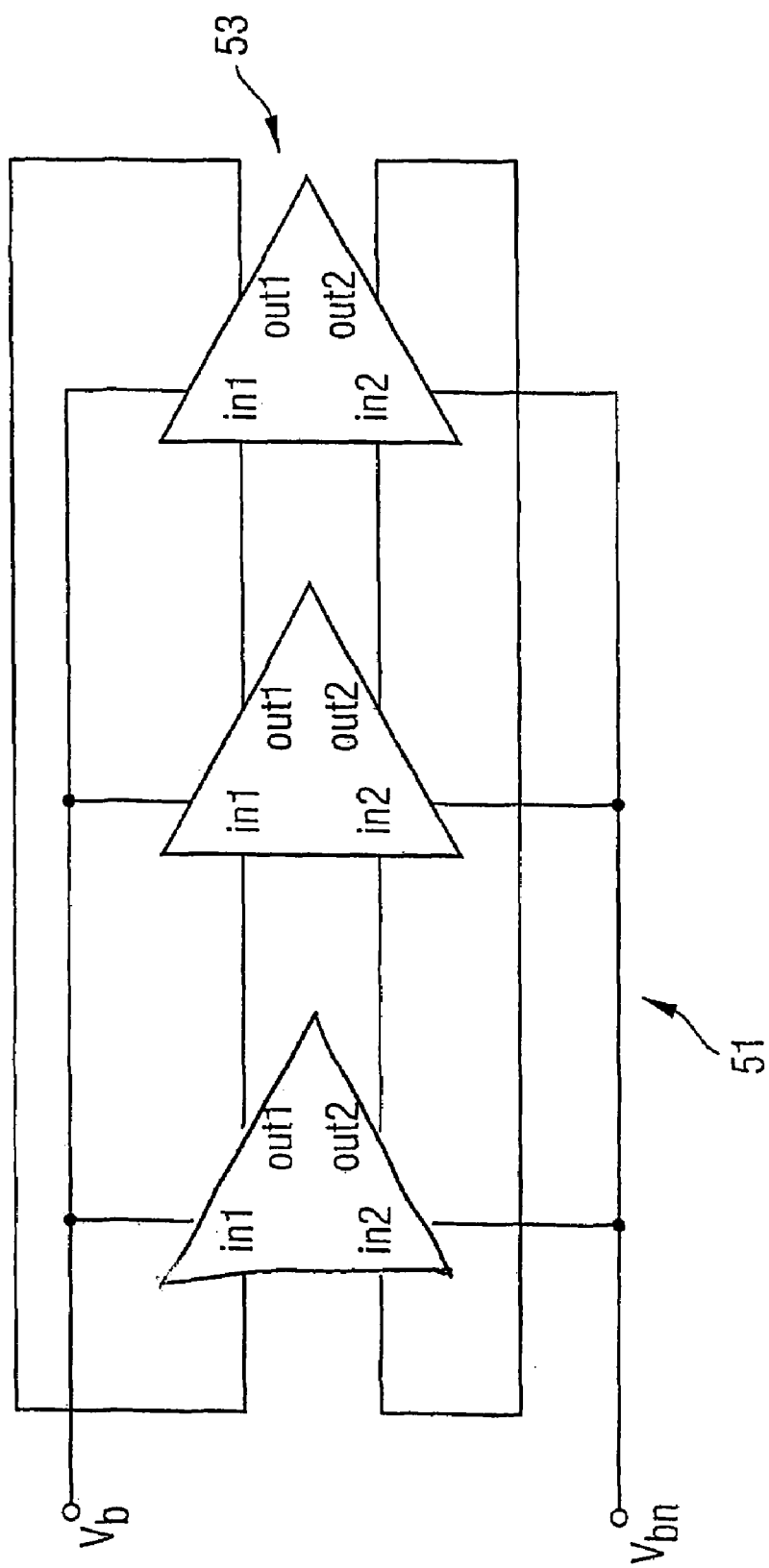
FIG. 9 shows the three stages of the CCO.

FIG. 2 illustrates a circuit 21 of a 3-stage CCO processed in a C11N digital CMOS. FIG. 9 shows the entire 3-stage CCO 51 where the circuit 21 would be positioned as the stage 53. The circuit achieves low sensitivity to process variation and linear gain over a broad frequency range by utilizing an RC//C loading structure 23. The difference between the prior art circuit of FIG. 1 and the inventive circuit of FIG. 2 is the loading. The source of a pMOS transistor 25 is connected in series to the drain of a pMOS transistor 27 through a capacitor 29. The series connection is connected between the differential outputs 10 and 8 parallel with the capacitor 16. Both gates of the transistors 25 and 27 are tied to ground.

As compared to the CCO design of the Maneatis reference, the CCO of the present invention has a linear region of CCO gain extended by over 50% and the process and temperature sensitivity of the CCO gain is reduced by between 33% and 75% at an output frequency range of 500 MHz to 1.25 GHz.

Figure 4A:
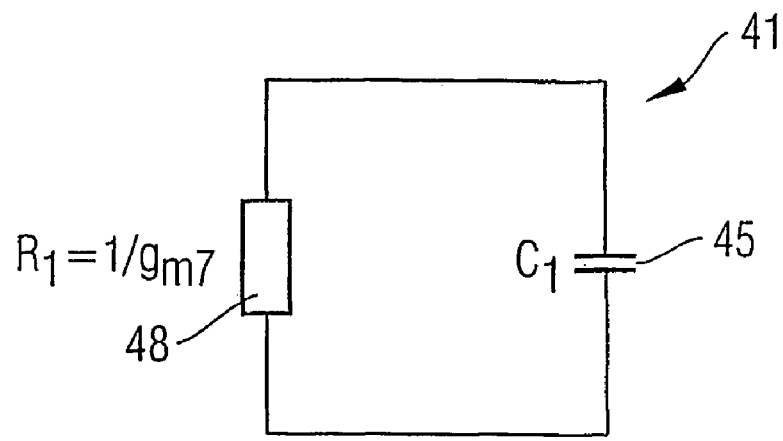
FIGS. 4(a) and 4(b) are equivalent circuit models of the circuits in FIG. 1 and FIG. 2, respectively.
Figure 4B:
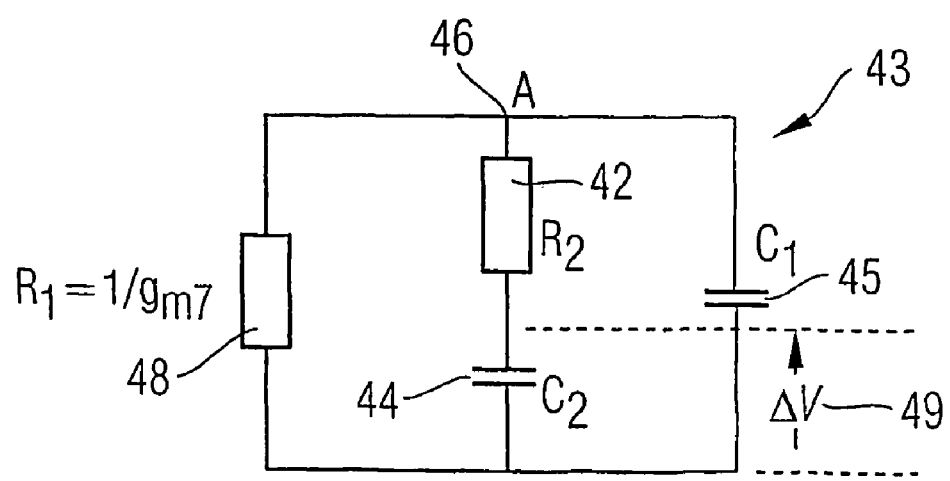

FIG. 4(a) illustrates an equivalent circuit diagram 41 of the loading of the conventional CCO circuit of FIG. 1 and FIG. 4(b) illustrates an equivalent circuit diagram 43 of the inventive CCO circuit of FIG. 2.

In FIG. 4(a) a resistance R1 48 is connected to a capacitance C1 45. Here $R_1 \approx 1/g_{m7}$ and $C_1$ 45 equals the sum of the capacitor C 16 and the loading capacitor $C_{gs}$ of next stage of the CCO (see FIG. 9). Here, gm7 is the equivalent gm of a symmetrical load, i.e. transistor pair 9, 11 or 13, 15. Also, $C_{gs}$ of next stage is the Cgs of the transistors 12, 14 in FIG. 2. This circuit has one dominant pole located at:

$$P_1 = \frac{1}{R_1 C_1} = \frac{g_{m7}}{C_1} \quad (1.1)$$

The oscillation frequency of this CCO is:

$$f_{osc} = \frac{1}{6 R_1 C_1} = \frac{g_{m7}}{6 C_1} \quad (1.2)$$

As a tuning current 55 changes, the value of $g_{m7}$ also changes, thus changing the output frequency.

In FIG. 4(b) the RC//C loading structure 23 of FIG. 2 is represented by an additional series connection between a resistance R2 42 and a capacitance C2 44 added in parallel with the capacitance C1 45. $R_1, C_1$ has the same value as in FIG. 4(a). Note that there is an always-on pMOS transistor and a capacitor $C_2$ 44 connected serially in this circuit, resulting in more complex loading of the circuit 21. Calculations show that this loading has 2 poles and 1 zero located at:

$$P_1 = \frac{-(\tau_1 + \tau_2 + R_1 C_2) + \sqrt{(\tau_1 + \tau_2 + R_1 C_2)^2 - 4\tau_1 \tau_2}}{2\tau_1 \tau_2} \quad (1.3)$$

$$P_2 = \frac{-(\tau_1 + \tau_2 + R_1 C_2) - \sqrt{(\tau_1 + \tau_2 + R_1 C_2)^2 - 4\tau_1 \tau_2}}{2\tau_1 \tau_2} \quad (1.4)$$

$$Z_1 = \frac{1}{R_2 C_2} \quad (1.5)$$

Where $\tau_1 = R_1 C_1$ and $\tau_2 = R_2 C_2$.

The formula is complex, so for better understanding of the pole zero movement on the S plane, an assumption is made that $C_1 = C_2$, and that the resistor $R_2$ 42 is the only variable. Three extreme cases are considered.

$$P_2 = -\frac{1}{\tau_2}, P_1 = -\frac{1}{\tau_1} \quad \tau_2 \gg \tau_1 \quad (1.6)$$

$$P_2 = -\frac{3+\sqrt{5}}{2}\tau, P_1 = -\frac{3-\sqrt{5}}{2}\tau \quad \tau_2 = \tau_1 = \tau \quad (1.7)$$

$$P_2 = -\frac{1}{\tau_2}, P_1 = -\frac{1}{2\tau_1} \quad \tau_2 \ll \tau_1 \quad (1.8)$$

Figure 5:
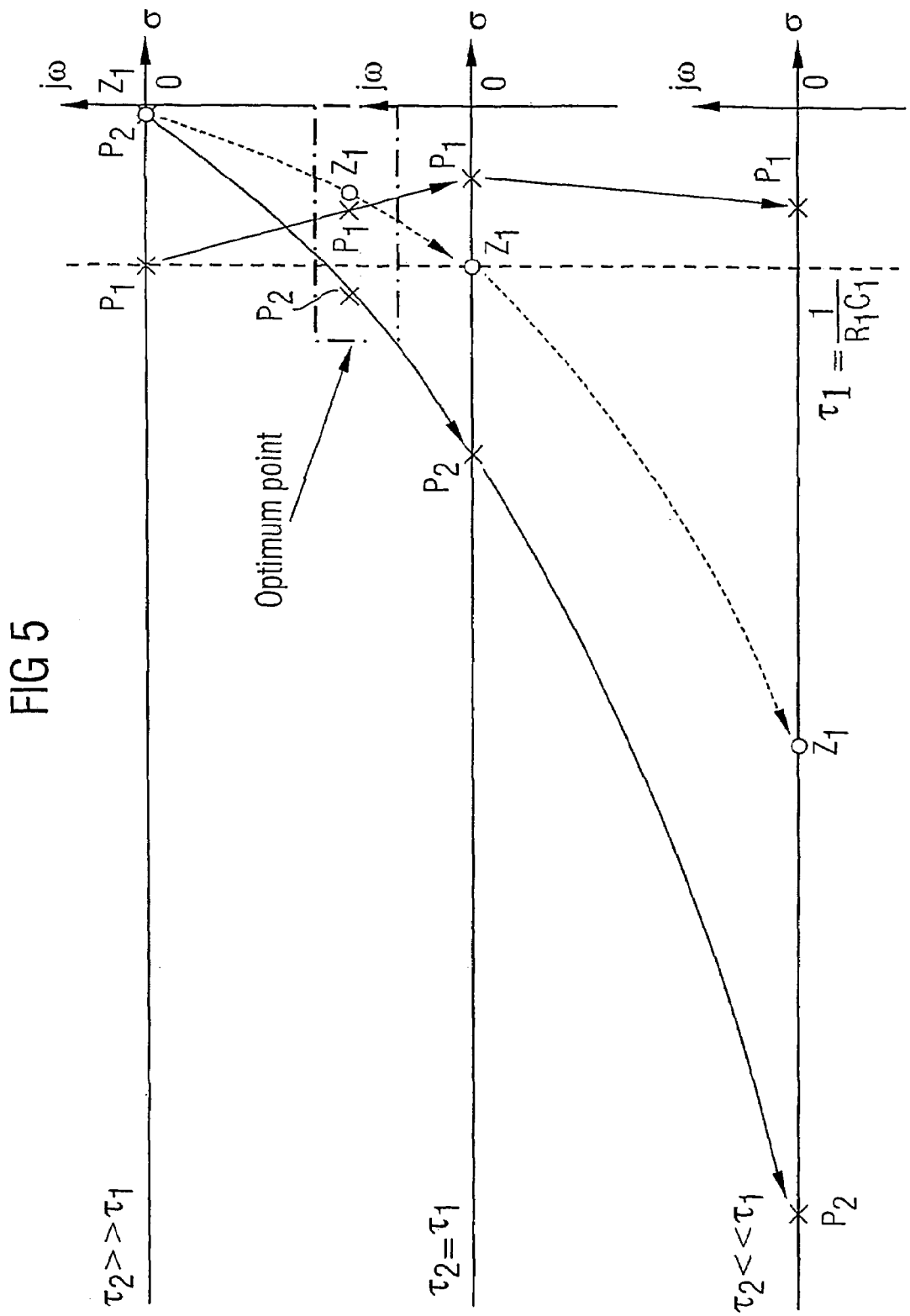
FIG. 5 is a pole zero diagram for the circuit of FIG. 4(b).

The pole zero diagram of FIG. 5 shows the movement of the poles and zero in equation 1.6-1.8. $P_1$ starts at $$-\frac{1}{R_1 C_1},$$

moving toward 0 and stopping at $$-\frac{1}{2 R_1 C_1},$$

while $P_2$ moves from 0 to negative infinity. $Z_1$ starts from 0 and stops at $P_2/2$.

From FIG. 5, an interesting finding is that if the pole and zero are set at the location in the box labeled "optimum point", the oscillation frequency is determined by $P_2$, rather than $P_1$, thus increasing the oscillation frequency. Thus, by properly selecting the transistor sizes of the transistors 25 and 27 in FIG. 2, the resistance of these transistors can dominate the oscillation frequency at the high frequency range and compensate the flat portion of the curves in FIG. 6, thereby extending the linear range.

Figure 6:
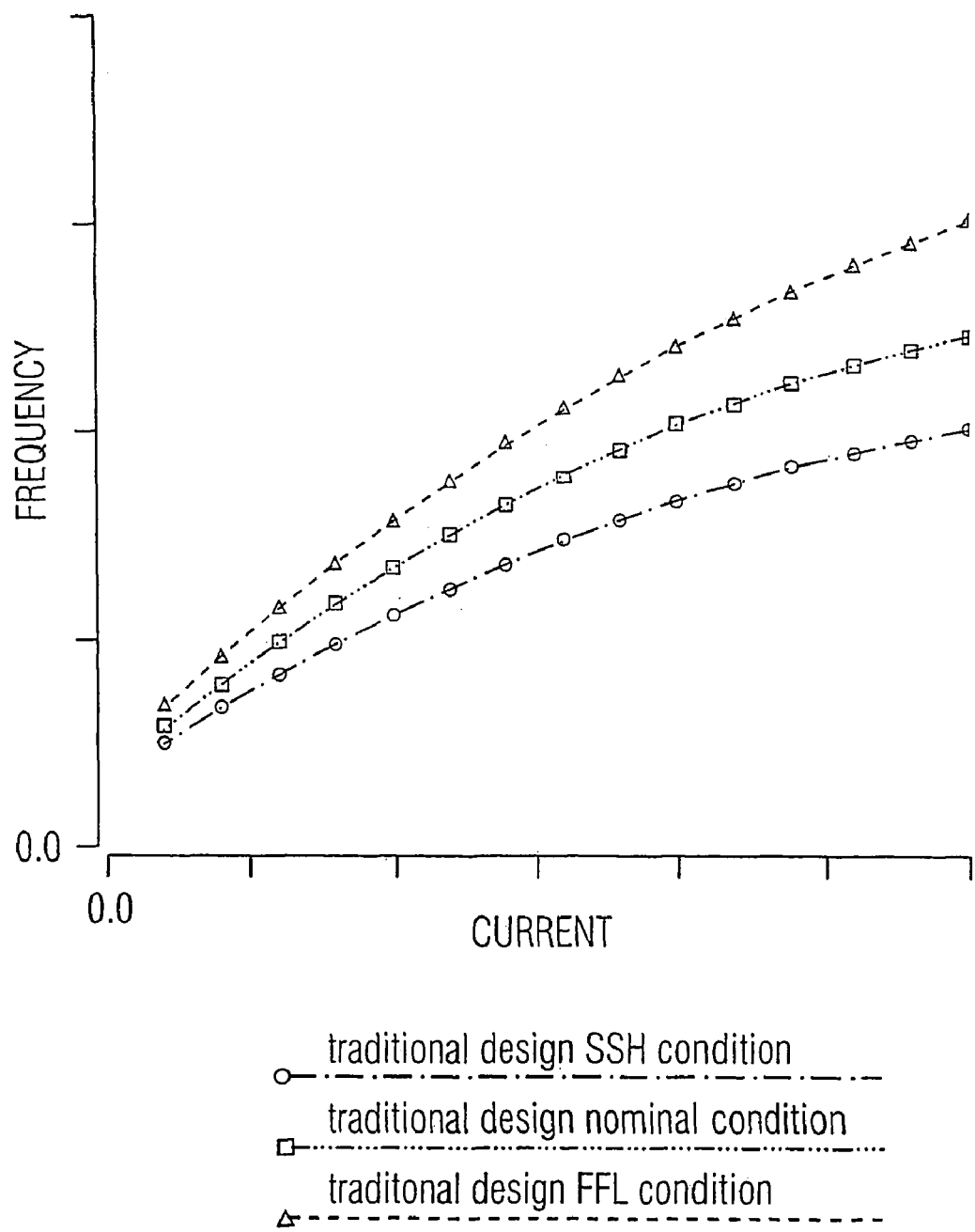
FIG. 6 plots the CCO gain of the circuit of FIG. 1 for three different process and temperature conditions.

As mentioned before, the relationship between $g_{m7}$ (resistor $R_1$) and the tuning/control current $I_{ctrl}$ is not linear. Due to the velocity saturation, $g_{m7}$ will become a constant value after the control current reaches a certain value. In the circuit 7 of FIG. 1, the CCO gain will become 'flat' at high frequency. (As shown in FIG. 6). However, in the circuit 21 of FIG. 2, the linear range of CCO gain is extended.

Figure 7:
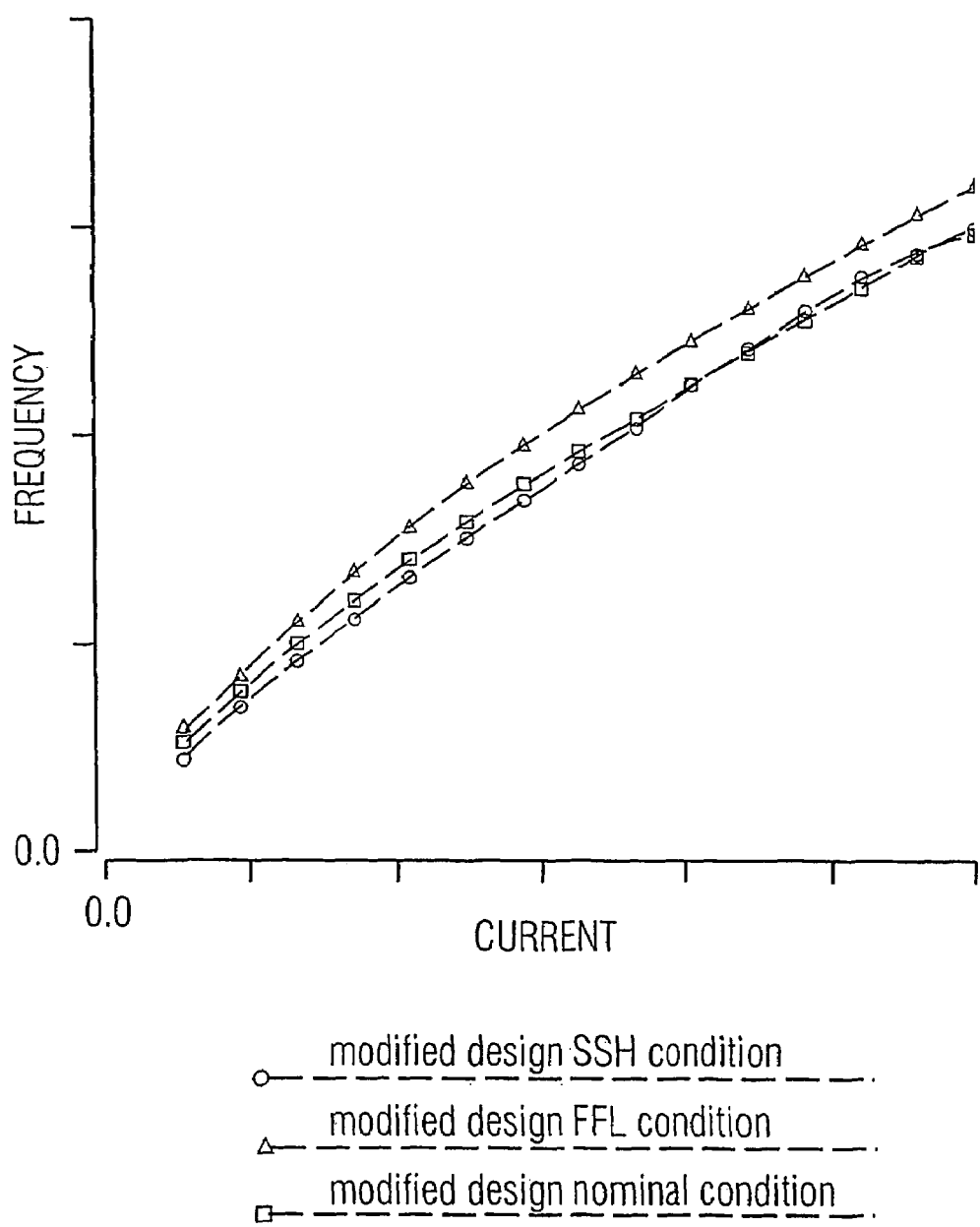
FIG. 7 plots the CCO gain of the gain compensated circuit of FIG. 2 for three different process and temperature conditions.

FIG. 4b, illustrates how the always-on pMOS transistor and capacitance C2 44 form an RC branch. During operation, because of the oscillation, the voltage swings at node A 46. The capacitor $C_2$ 44 is continuously charged and discharged. The relationship between the average charge and discharge current and the oscillation frequency $f_{osc}$ is determined by equation 1.9

$$\frac{1}{2f_{osc}} \cdot I_c = C_2 \Delta V \qquad (1.9)$$

Where $I_c$ is the average charge-discharge current and $\Delta V$ 49 is the voltage variation across the capacitor $C_2$ 44. If $\Delta V$ 49 remains unchanged, $I_c$ is proportional to oscillation frequency $f_{osc}$. The resistance value of the always-on pMOS transistor ($R_2$ 42) is not a constant, it will increase with the charge current $I_c$. In the present invention, the transistor size is selected so that the pole generated by resistor $R_2$ 42 dominates the oscillation frequency at the flat potion of CCO gain curve in FIG. 6. It compensates the flat portion of curve and extends the linear range. The simulation results of CCO gain by using the circuits 7 and 21 of FIG. 1 and FIG. 2 are shown in FIG. 6 and FIG. 7, respectively. FIG. 7, like FIG. 6, illustrates the CCO gain, but this time for the circuit 21 of FIG. 2. Control current (in Amps) is plotted along the x-axis while frequency (in Hertz) is plotted along the y-axis. There are separate curves for different design process corners and temperatures. The curves represent the SSH (slow-slow, high temperature), normal and FFL (fast-fast, low temperature) conditions.

FIG. 7 shows that the spread of the CCO gain curves between different operating conditions becomes smaller for the circuit 21 of the present invention. This is because for the FFL condition, the variation of the resistance value of $R_2$ 42 (the resistance value of the transistors 25, 27) is small and for the SSH condition, the resistor value of $R_2$ 42 is large. Thus, $R_2$ 42 has more effect on the SSH case than the FFL case, causing the curve for the SSH case to move towards the curve for the FFL case, thus reducing the CCO gain sensitivity due to process variation. For the same reason, the SSH curve actually overlaps the curve for nominal case at high frequency.

Figure 3:
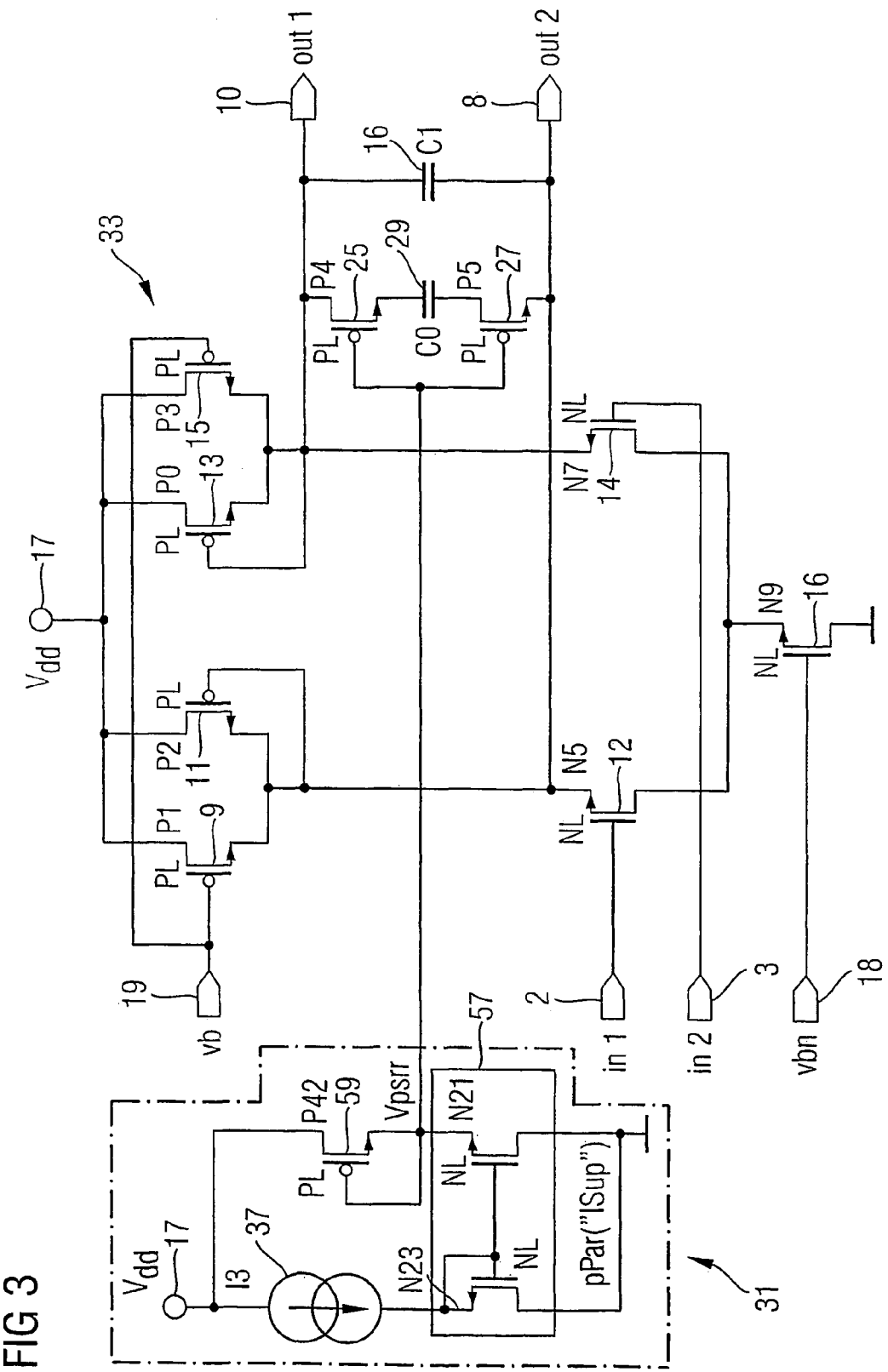
FIG. 3 shows a stage of the CCO as in FIG. 2, but including a power supply rejection ratio (PSRR) compensation section.

FIG. 3 illustrates another embodiment of the present invention including a power supply rejection ratio (PSRR) compensation section 31. The transistors 25, 27 of the circuit 21 in FIG. 2 act as resistors. A change in the power supply voltage Vdd changes the resistance value of the transistors 25, 27 and therefore the frequency behavior. The transistors 25, 27 act in a non-differential way and can therefore degrade the power supply rejection ratio (PSRR). Rather than tying the gates of the transistors 25, 27 to ground as in FIG. 2, the gates are attached to the PSRR compensation section 31 which tracks variation of a power supply. The voltage at a node 35 tracks the supply voltage Vdd at 17. The PSRR compensation includes a diode 59, a current source 37 and a current mirror 57. The voltage potential Vpsrr and the CCO output have the same variation relative to the power supply. Therefore, the resistances of the transistors 25, 27 of FIG. 3 become independent of power supply variation.

Figure 8:
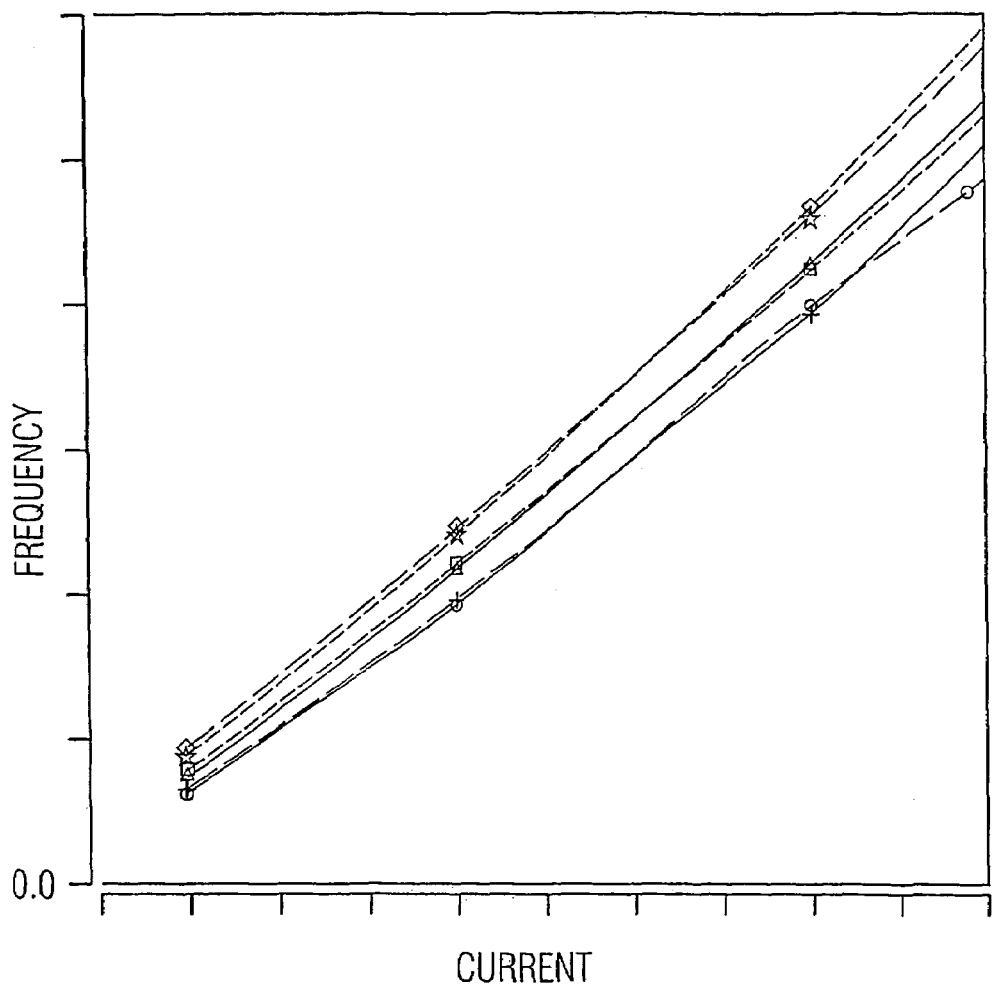
FIG. 8 plots the CCO gain of the PSRR compensated circuit of FIG. 3 for two different power supply voltages and for each of three different process and temperature conditions.

FIG. 8, like FIGS. 6 and 7, illustrates the CCO gain, but this time for the circuit 33 of FIG. 3. Control current (in amps) is plotted along the x-axis while frequency (in Hertz) is plotted along the y-axis. There are separate curves for different design process corners and temperatures. The curves represent the SSH (slow-slow, high temperature), normal and FFL (fast-fast, low temperature) conditions. Also, in order to illustrate PSRR performance, curves are plotted for two different Vdd's (1.65 V and 1.35 V) for each set of process corners and temperatures. From FIG. 8 it can be seen that the circuit 33 has good PSRR performance.

Returning to FIG. 9, the cell 53 can be circuit 21 or 33 of the present invention.

In another alternative embodiment, the gates of the transistors 25, 27 can be connected to different potentials to get other advantages such as better PSRR, better TC (temperature coefficient) etc.

In the illustrated embodiments, other combinations of impedances can be serve as the loading structure 23 and the PSRR compensation section 31. Thus, although the invention has been described above using particular embodiments, many variations are possible within the scope of the claims, as will be clear to a skilled reader.

We claim:

1. An arrangement for use in a current controlled oscillator comprising:
    a first section providing a first differential output;
    a second section providing a second differential output; and
    a loading structure electrically connecting the first differential output with the second differential output, the loading structure including at least one resistive element in series with at least one reactive element to form a series combination, the series combination being connected in parallel with a further reactive element, the loading structure having a time constant determined dominantly by the series combination at high control current, the loading structure configured to substantially extend the linear operating frequency range of the current controlled oscillator.

2. The arrangement of claim 1, wherein the first and second section are comprised of at one least parallel connection and at least one series connection of transistors.

3. The arrangement of claim 1, wherein the loading structure includes at least one transistor and at least one capacitor.

4. The arrangement of claim 3, wherein each of the at least one transistors of the loading structure has a gate operably coupled to ground.

5. The arrangement of claim 3, further comprising a power supply rejection ratio compensation section configured to compensate at least partially for variations in power supply voltage, the power supply rejection ratio compensation section operably coupled to at least one gate of the at least one transistor of the loading structure.

6. The arrangement of claim 5, wherein the power supply rejection ratio compensation section, the first section and the second section are powered by the same power supply voltage, and wherein the power supply rejection ratio compensation section includes a diode and a current source.

7. The arrangement of claim 1, wherein the at least one resistive element comprises at least one transistor and the at least one reactive element comprises at least one capacitive element.

8. The arrangement of claim 7, wherein each of the at least one transistors comprises a field effect transistor.

9. The arrangement of claim 8, wherein the field effect transistor comprises a pMOS transistor.

10. An arrangement for use in a current controlled oscillator comprising:
    a first transistor circuit providing a first differential output;
    a second transistor circuit section providing a second differential output; and a loading circuit to couple between the first differential output and the second differential output comprised of at least one resistive element in series with at least one capacitive element to form a series combination, the series combination being connected in parallel with a further capacitive element.

11. The arrangement of claim 10, wherein each of the first transistor circuit and the second transistor circuit comprises:
first and second parallel transistors coupled in series with a series transistor.

12. The arrangement of claim 10, wherein the series combination includes at least one transistor and at least one capacitor coupled in series.

13. The arrangement of claim 12, wherein each of the at least one transistors of the series combination has a gate operably coupled to ground.

14. The arrangement of claim 12, further comprising a power supply rejection ratio compensation section configured to compensate at least partially for variations in power supply voltage, the power supply rejection ratio compensation section operably coupled to at least one gate of the at least one transistor of the series combination.

15. The arrangement of claim 14, wherein the power supply rejection ratio compensation section includes a diode and a current source.

16. The arrangement of claim 10, wherein the series combination includes two transistors coupled by a capacitor.

17. The arrangement of claim 16, wherein each of the at least one transistors comprises a field effect transistor.

18. The arrangement of claim 17, wherein the field effect transistor comprises a pMOS transistor.

19. An arrangement for use in a current controlled oscillator comprising:
a first section providing a first differential output;
a second section providing a second differential output;
a loading structure comprised of at least resistive element and at least one active element electrically connecting the first differential output with the second differential output, the resistive and reactive elements configured to substantially extend the linear operating frequency range of the current controlled oscillator, wherein the loading structure includes at least one transistor and at least one capacitor, and
a power supply rejection ratio compensation section configured to compensate at least partially for variations in power supply voltage, the power supply rejection ratio compensation section operably coupled to at least one gate of the at least one transistor of the loading structure.

20. The arrangement of claim 19, wherein the power supply rejection ratio compensation section, the first section and the second section are powered by the same power supply voltage, and wherein the power supply rejection ratio compensation section includes a diode and a current source.

21. An arrangement for use in a current controlled oscillator comprising:
a first transistor circuit providing a first differential output;
a second transistor circuit section providing a second differential output;
a loading circuit including at least a first capacitive element coupled between the first differential output and the second differential output and a resistive and capacitive series circuit coupled between the first differential output with the second differential output, wherein the resistive and capacitive series circuit includes at least one transistor and at least one capacitor coupled in series, and
a power supply rejection ratio compensation section configured to compensate at least partially for variations in power supply voltage, the power supply rejection ratio compensation section operably coupled to at least one gate of the at least one transistor of the resistive/capacitive series circuit.

22. The arrangement of claim 21, wherein the power supply rejection ratio compensation section includes a diode and a current source.

* * * * *